(12) United States Patent
Chaplik

(10) Patent No.: US 7,079,646 B2
(45) Date of Patent: Jul. 18, 2006

(54) ADSL RECEIVER HIGH PASS FILTER ARCHITECTURE

(75) Inventor: Naom Chaplik, San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 831 days.

(21) Appl. No.: 10/245,205

(22) Filed: Sep. 17, 2002

(65) Prior Publication Data

US 2003/0235296 A1 Dec. 25, 2003

Related U.S. Application Data

(60) Provisional application No. 60/390,427, filed on Jun. 19, 2002.

(51) Int. Cl.
*H04M 1/00* (2006.01)

(52) U.S. Cl. .............. 379/390.02; 379/93.05; 379/414

(58) Field of Classification Search ........... 379/93.05, 379/390.02, 414
See application file for complete search history.

(56) References Cited

U.S. PATENT DOCUMENTS

| | | | |
|---|---|---|---|
| 6,831,975 B1 * | 12/2004 | Easwaran et al. | 379/390.02 |
| 2004/0248542 A1 * | 12/2004 | Heuermann et al. | 379/390.02 |

* cited by examiner

*Primary Examiner*—Jefferey F. Harold
(74) *Attorney, Agent, or Firm*—Abdul Zindani; W. James Brady, III; Frederick J. Telecky, Jr.

(57) ABSTRACT

An ADSL receiver HPF architecture 300 that reduces the number of Op Amps below that required for known ADSL receiver HPFs. The ADSL receiver HPF 300 is implemented as an active RC filter to provide a single fifth-order Elliptic filter instead of the more conventional pair of third-order Elliptic filters. Since the HPF Elliptic filter stage having the lowest Q factor is reduced as the order of an Elliptic filter transfer function is increased, a single fifth-order Elliptic filter suitable for use as an ADSL receiver HPF can be implemented using only one Op Amp in the second $2^{nd}$-order HPF stage 308. A notch (imaginary zero) is provided by summing of output signals associated with active RC structure state variables. This structure minimizes the number of capacitors while preserving the capability to provide a high Q factor for the first $2^{nd}$-order HPF stage 304.

20 Claims, 2 Drawing Sheets

US 7,079,646 B2

ADSL RECEIVER HIGH PASS FILTER ARCHITECTURE

This application claims priority under 35 USC § 119(e)(1) of provisional application Ser. No. 60/390,427, filed Jun. 19, 2002.

BACKGROUND OF THE INVENTION

1. Field of the Invention

This invention relates generally to active high pass filters, and more particularly to an asymmetric digital subscriber line (ADSL) receiver high pass filter (OPF) architecture.

2. Description of the Prior Art

An asymmetric digital subscriber line (ADSL) receiver comprises a large number of operational amplifiers (Op Amps) and is generally implemented in an application specific integrated circuit (ASIC) to conserve on space, provide for reduced power consumption, and to minimize manufacturing costs. The number of Op Amps used to implement the ASIC is important because the ADSL receiver high pass filter (HPF) must be a low noise circuit, implying a high supply current, that increases power dissipation and consequently, silicon area requirements.

Programmable gain amplification (PGA) is generally used to provide acceptable noise performance and also to avoid saturation of Op Amps that are employed in ADSL receivers. The gain is high for low receiving levels and low for high receiving levels.

Known ADSL receivers employ a large number of Op Amps due to the architecture of the associated BPF 100 shown in FIG. 1 that uses PGA. This well-known HPF architecture is based on two third-order Elliptic filters. The first third-order Elliptic filter includes first-order HPF stage 102 and second-order HPF notch stage 104. The second third-order Elliptic filter includes first-order HPF stage 106 and second-order HPT notch stage 108. The second third-order Elliptic filter 106, 108 is a copy of the first third-order Elliptic filter 102, 104.

Each of the third-order Elliptic filters shown in FIG. 1 is implemented using the HPF circuit 200 shown in FIG. 2. Op Amp 202 is used to implement a first-order BPF transfer function. Op Amps 204 and 206 are used to implement a second order HPF transfer function having a notch (imaginary zero). HPF circuit 200 is identical for each third-order HPF, as stated herein before.

The first third-order Elliptic HPF 102, 104 and the second third-order Elliptic HPF 106, 108 provide for rejection of the transmitter signal in the bandwidth between 30 kHz–180 kHz, and provides gain for frequencies above 180 kHz. The value of gain is dependent on the received signal level.

The PGA associated with the first first-order HPF stage 102 and the first second-order stage BPF 104 effectively provide the level of −150 dBm/Hz noise. This low level of noise is necessary to avoid limitations caused by amplifier front-end (AFE) noise. The PGA in each stage of HPF 100 is also required to minimize the noise caused by the respective HPF resistors and Op Amps. The second third-order filter 106, 108 provides additional rejection of the transmitted signal in the bandwidth 30 kHz–180 kHz.

The well known HPF 100 is problematic however, in that despite the fact that each of the third-order filters 102/104 and 106/108 are Elliptic, the total sixth-order HPF 100 is not an Elliptic filter, and undesirably produces high Q factors for each of the second-order stages 104 and 108. This solution can also be seen to require two Op Amps and the addition of three capacitors for each second-order stage 104 and 108.

It is therefore both advantageous and desirable in view of the foregoing, to provide an ADSL receiver HPF architecture that reduces the number of Op Amps employed in the ADSL receiver HPF.

SUMMARY OF THE INVENTION

The present invention is directed to an ADSL receiver HPF architecture that reduces the number of Op Amps below that required for known ADSL receiver HPFs. The ADSL receiver HPF is implemented as an active RC filter to provide a single fifth-order Elliptic filter instead of the more conventional pair of third-order Elliptic filters. Since the HPF Elliptic filter stage having the lowest Q factor is reduced as the order of an Elliptic filter transfer function is increased, a single fifth-order Elliptic filter suitable for use as an ADSL receiver HPF can be implemented using only one Op Amp in the second second-order HPF stage. A notch (imaginary zero) is provided by summing of output signals associated with active RC structure state variables. This structure minimizes the number of capacitors while preserving the capability to provide a high Q factor for the first second-order HPF stage.

According to one embodiment, an ADSL receiver high pass filter (HPF) comprises a $1^{st}$-order HPF stage having a programmable gain amplifier (PGA); a first $2^{nd}$-order HPF stage operational to generate a plurality of output signals in response to an output signal generated via the $1^{st}$-order HPF stage; a summing stage having a PGA and that is operational to sum the output signal generated via the $1^{st}$-order HPF stage and the plurality of output signals generated via the first $2^{nd}$-order HPF stage to generate an output signal; and a second $2^{nd}$-order HPF stage operational to generate a desired ADSL receiver HPF signal in response to the summing stage output signal.

BRIEF DESCRIPTION OF THE DRAWING

Other aspects and features of the present invention and many of the attendant advantages of the present invention will be readily appreciated as the same become better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
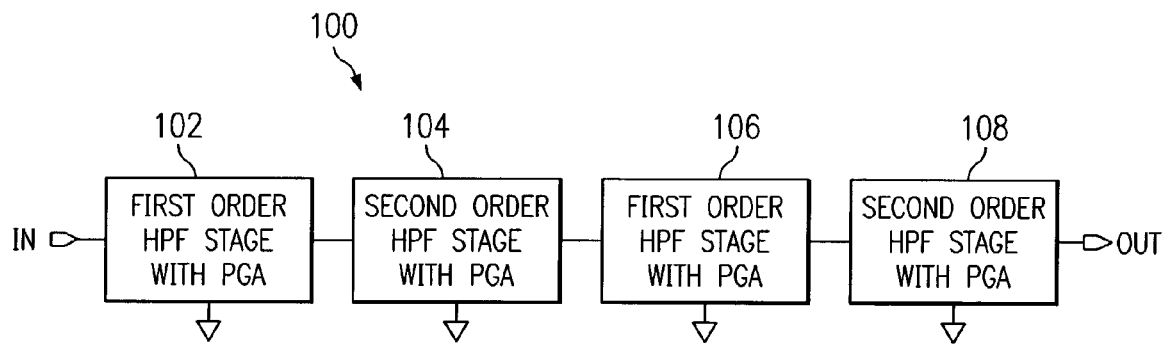
FIG. 1 is a simplified block diagram illustrating a prior art ADSL receiver HPF architecture.
Figure 2:
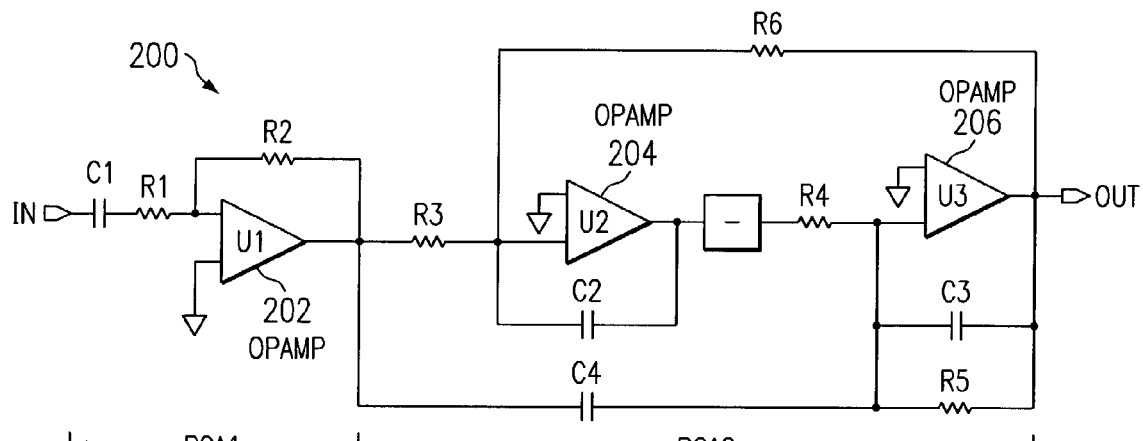
FIG. 2 is a schematic diagram illustrating a $1^{st}$-order HPF stage in tandem with a $2^{nd}$-order HPF stage and that is used to implement the respective $1^{st}$-order HPF stage and $2^{nd}$-order HPF stage portions of the ADSL receiver HPF architecture shown in FIG. 1.
Figure 3:
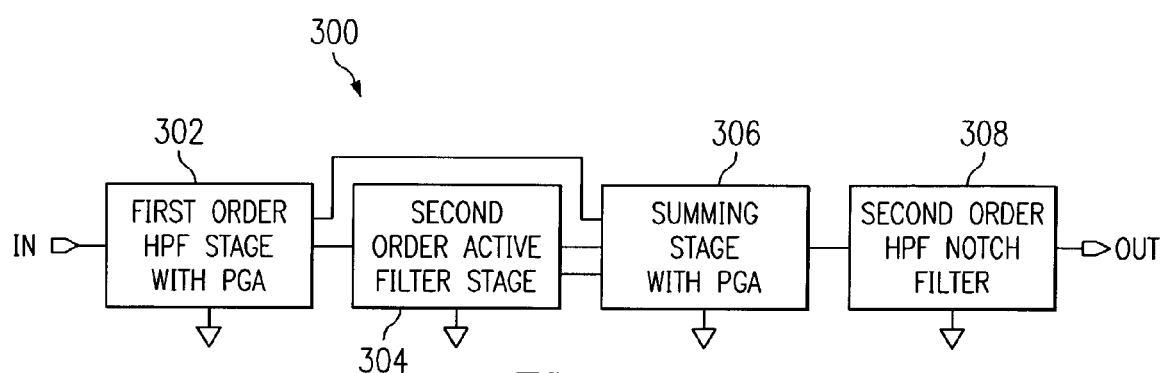
FIG. 3 is a simplified block diagram illustrating an ADSL receiver HPF architecture according to one embodiment of the present invention.

FIG. 3 is a simplified block diagram illustrating an ADSL receiver HPF architecture 300 according to one embodiment of the present invention. HPF architecture 300 can be seen to have a 1$^{st}$-order HPF input stage 302 with a PGA followed by a 2$^{nd}$-order active filter stage 304. Output 302 and the 2$^{nd}$-order active filter stage 304 are summed in a summing stage 306 to provide the desired imaginary zero in the HPF 300 transfer function. The signal output from the summing stage 306 is then processed by a 2$^{nd}$-order HPF notch filter 308 to provide the desired ADSL receiver HPF signal. Together, the 1$^{st}$-order HPF input stage 302, 2$^{nd}$-order active filter stage 304, summing stage 306, and 2$^{nd}$-order HPF notch filter 308 provide a fifth order Elliptic filter.

Figure 4:
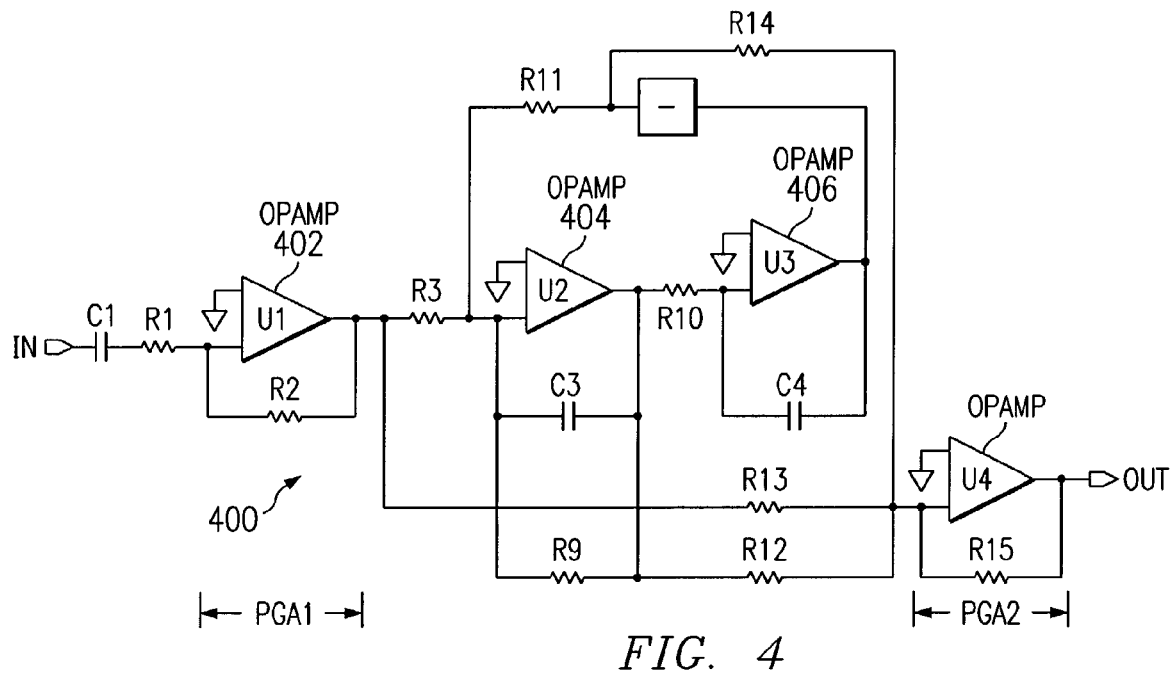
FIG. 4 is a schematic diagram illustrating a more detailed view of the $1^{st}$-order HPF stage, the $2^{nd}$-order active filter stage, and the summing stage depicted in FIG. 3 according to one embodiment of the present invention.

FIG. 4 is a schematic diagram illustrating a more detailed view of the 1$^{st}$-order HPF stage 302, the 2$^{nd}$-order active filter stage 304, and the summing stage 306 depicted in FIG. 3 according to one embodiment of the present invention. More specifically, FIG. 4 shows a state variable structure 400 for these elements 302, 304, 306 in which the summing stage 306 is configured to provide an imaginary zero with PGA functionality. This structure has been found by the present inventor to reduce the overall number of capacitors necessary to implement the ADSL receiver HPF 300.

The transfer function between Op Amp 402 and Op Amp 404 can be identified by a mathematical relationship written as $$Tu2(s) = \frac{B1 \cdot s}{A2 \cdot s^2 + A1 \cdot s + 1}.$$

The transfer function between Op Amp 402 and Op Amp 406 can be identified by a mathematical relationship written as $$Tu3(s) = \frac{B0}{A2 \cdot s^2 + A1 \cdot s + 1}.$$

The total transfer function of the 1$^{st}$-order HPF stage 302, the 2$^{nd}$-order active filter stage 304, and the summing stage 306 depicted in FIGS. 3 and 4 can be identified by a mathematical relationship written as $$T(s) = \left(\frac{R15}{R14}\right) \cdot Tu3(s) + \left(\frac{R15}{R12}\right) \cdot Tu2(s) + \frac{R15}{R13}$$

$$= K0 \frac{(B2T \cdot s^2 + B1T \cdot s + 1)}{A2 \cdot s^2 + A1 \cdot s + 1},$$

where $K0 = \left[\left(\frac{R15}{R14}\right) \cdot B0 + \frac{R15}{R13}\right]$, $$B2T = \frac{\left(A2 \cdot \frac{R15}{R13}\right)}{K0}, \text{ and } B1T = \frac{\left[\left(\frac{R15}{R13}\right) \cdot A1 + \left(\frac{R15}{R12}\right) \cdot B1\right]}{K0}.$$

The B1T term is equal to zero for the imaginary zero.

Figure 5:
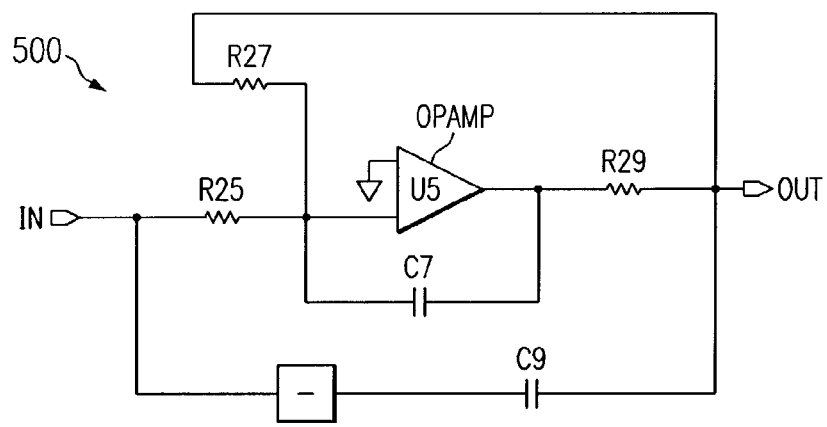
FIG. 5 is a schematic diagram illustrating a more detailed view of the $2^{nd}$-order HPF notch stage depicted in FIG. 3 according to one embodiment of the present invention.

FIG. 5 is a schematic diagram illustrating a more detailed view of the 2$^{nd}$-order HPF notch stage 308 depicted in FIG. 3 according to one embodiment of the present invention. It can be seen that the second 2$^{nd}$-order stage 308 of Elliptic HPF 300 is implemented using a single Op Amp active RC filter 500.

In summary explanation, a fifth-order Elliptic HPF filter 300 architecture is presented in which a stage with a high Q factor and imaginary zero are provided by a summing stage 306 implemented as a PGA. The HPF filter 300 architecture allows use of a single active RC filter having a single Op Amp and fewer capacitors as the second 2$^{nd}$-order stage of an ADSL receiver Elliptic HPF architecture.

In view of the above, it can be seen the present invention presents a significant advancement in the art of "ADSL receiver HPF filtering" techniques. Further, this invention has been described in considerable detail in order to provide those skilled in the active filter art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. An ADSL receiver high pass filter (HPF) comprising:
   a 1$^{st}$-order HPF stage configured as a programmable gain amplifier (PGA);
   a first 2$^{nd}$-order HPF stage operational to generate a plurality of output signals in response to an output signal generated via the 1$^{st}$-order HPF stage;
   a summing stage configured as a PGA and that is operational to sum the output signal generated via the 1$^{st}$-order HPF stage and the plurality of output signals generated via the first 2$^{nd}$-order HPF stage to generate a summing signal; and
   a second 2$^{nd}$-order HPF stage operational to generate a desired ADSL receiver HPF signal in response to the summing signal.

2. The ADSL receiver HPF according to claim 1 wherein the 1$^{st}$-order HPF stage comprises an Elliptic filter.

3. The ADSL receiver HPF according to claim 1 wherein the first 2$^{nd}$-order HPF stage comprises an active RC filter.

4. The ADSL receiver HPF according to claim 1 wherein the first 2$^{nd}$-order HPF stage comprises an Elliptic filter.

5. The ADSL receiver HPF according to claim 1 wherein the second 2$^{nd}$-order HPF stage comprises an active RC filter.

6. The ADSL receiver HPF according to claim 1 wherein the second 2$^{nd}$-order HPF stage comprises an Elliptic filter.

7. The ADSL receiver HPF according to claim 1 wherein the 1$^{st}$-order HPF stage, first 2$^{nd}$-order HPF stage and second 2$^{nd}$-order HPF stage together comprise a 5$^{th}$-order Elliptic filter.

8. The ADSL receiver HPF according to claim 1 wherein the second 2$^{nd}$-order HPF stage comprises a notch filter.

9. The ADSL receiver HPF according to claim 1 wherein the second 2$^{nd}$-order HPF stage comprises no more than one Operational Amplifier.

10. The ADSL receiver HPF according to claim 1 wherein the 1$^{st}$-order HPF stage, first 2$^{nd}$-order HPF stage, summing stage; and second 2$^{nd}$-order HPF stage together have a transfer function T(s) defined according to a mathematic relationship written as $$T(s) = \left(\frac{R15}{R14}\right) \cdot Tu3(s) + \left(\frac{R15}{R12}\right) \cdot Tu2(s) + \frac{R15}{R13}$$

$$= K0 \frac{(B2T \cdot s^2 + B1T \cdot s + 1)}{A2 \cdot s^2 + A1 \cdot s + 1},$$

where $K0 = \left[\left(\frac{R15}{R14}\right) \cdot B0 + \frac{R15}{R13}\right]$, $$B2T = \frac{\left(A2 \cdot \frac{R15}{R13}\right)}{K0}, \text{ and } B1T = \frac{\left[\left(\frac{R15}{R13}\right) \cdot A1 + \left(\frac{R15}{R12}\right) \cdot B1\right]}{K0},$$

and wherein R15 forms a feedback path associated with the summing stage, R12 forms a first feedback path between the summing stage and the first $2^{nd}$-order HPF stage, R14 forms a second feedback path between the summing stage and the first $2^{nd}$-order HPF stage, and R13 forms a feedback path between the summing stage and the $1^{st}$-order HPF stage.

11. An ADSL receiver high pass filter (HPF) comprising:
a $1^{st}$-order HPF stage;
a first $2^{nd}$-order HPF stage;
a summing stage; and
a second $2^{nd}$-order HPF stage, wherein the $1^{st}$-order HPF stage, first $2^{nd}$-order HPF stage, summing stage and second $2^{nd}$-order HPF stage are together configured as a fifth order Elliptic filter.

12. The ADSL receiver HPF according to claim 11 wherein the second $2^{nd}$-order HPF stage comprises an active RC filter having no more than one operational amplifier.

13. The ADSL receiver HPF according to claim 11 wherein the second $2^{nd}$-order HPF stage is configured as a notch filter.

14. The ADSL receiver HPF according to claim 11 wherein the summing stage is configured to sum signals generated via the $1^{st}$-order HPF stage and the first $2^{nd}$-order HPF stage.

15. The ADSL receiver HPF according to claim 11 wherein the $1^{st}$-order HPF stage is configured as a programmable gain amplifier.

16. The ADSL receiver HPF according to claim 11 wherein the summing stage is configured as a programmable gain amplifier.

17. The ADSL receiver HPF according to claim 11 wherein the $1^{st}$-order HPF stage, first $2^{nd}$-order HPF stage, summing stage; and second $2^{nd}$-order HPF stage together have a transfer function T(s) defined according to a mathematic relationship written as $$T(s) = \left(\frac{R15}{R14}\right) \cdot Tu3(s) + \left(\frac{R15}{R12}\right) \cdot Tu2(s) + \frac{R15}{R13}$$

$$= K0 \frac{(B2T \cdot s^2 + B1T \cdot s + 1)}{A2 \cdot s^2 + A1 \cdot s + 1},$$

-continued where $K0 = \left[\left(\frac{R15}{R14}\right) \cdot B0 + \frac{R15}{R13}\right]$, $$B2T = \frac{\left(A2 \cdot \frac{R15}{R13}\right)}{K0}, \text{ and } B1T = \frac{\left[\left(\frac{R15}{R13}\right) \cdot A1 + \left(\frac{R15}{R12}\right) \cdot B1\right]}{K0},$$

and wherein, R15 forms a feedback path associated with the summing stage, R12 forms a first feedback path between the summing stage and the first $2^{nd}$-order HPF stage, R14 forms a second feedback path between the summing stage and the first $2^{nd}$-order HPF stage, and R13 forms a feedback path between the summing stage and the $1^{st}$-order HPF stage.

18. An ADSL receiver high pass filter (HPF) comprising solely a single $5^{th}$-order Elliptic filter, wherein the $5^{th}$-order Elliptic filter has a $2^{nd}$-order notch filter having no more than one operational amplifier.

19. The ADSL receiver HPF according to claim 18 wherein the $5^{th}$-order Elliptic filter further comprises a $1^{st}$-order HPF stage in tandem with a first $2^{nd}$-order HPF stage and a summing stage, wherein the summing stage is configured to sum signals generated via the $1^{st}$-order HPF stage and the first $2^{nd}$-order HPF stage.

20. The ADSL receiver HPF according to claim 19 wherein the $1^{st}$-order HPF stage, first $2^{nd}$-order HPF stage, summing stage; and second $2^{nd}$-order HPF stage together have a transfer function T(s) defined according to a mathematic relationship written as $$T(s) = \left(\frac{R15}{R14}\right) \cdot Tu3(s) + \left(\frac{R15}{R12}\right) \cdot Tu2(s) + \frac{R15}{R13}$$

$$= K0 \frac{(B2T \cdot s^2 + B1T \cdot s + 1)}{A2 \cdot s^2 + A1 \cdot s + 1},$$

where $K0 = \left[\left(\frac{R15}{R14}\right) \cdot B0 + \frac{R15}{R13}\right]$, $$B2T = \frac{\left(A2 \cdot \frac{R15}{R13}\right)}{K0}, \text{ and } B1T = \frac{\left[\left(\frac{R15}{R13}\right) \cdot A1 + \left(\frac{R15}{R12}\right) \cdot B1\right]}{K0},$$

and wherein, R15 forms a feedback path associated with the summing stage, R12 forms a first feedback path between the summing stage and the first $2^{nd}$-order HPF stage, R14 forms a second feedback path between the summing stage and the first $2^{nd}$-order HPF stage, and R13 forms a feedback path between the summing stage and the $1^{st}$-order HPF stage.

* * * * *